United States Patent
Decker et al.

(10) Patent No.: US 9,729,188 B2
(45) Date of Patent: Aug. 8, 2017

(54) PROTECTING WIRELESS COMMUNICATION COMPONENTS IN A HIGHLY RESONANT FIELD

(71) Applicant: Electrochem Solutions, Inc., Clarence, NY (US)

(72) Inventors: Gregory G. Decker, Taunton, MA (US); Brian R. Peterson, Cumberland, RI (US); Eric Jankins, Raynham, MA (US)

(73) Assignee: Electrochem Solutions, Inc., Clarence, NY (US)

( * ) Notice: Subject to any disclaimer, the term of this patent is extended or adjusted under 35 U.S.C. 154(b) by 0 days.

(21) Appl. No.: 15/276,179

(22) Filed: Sep. 26, 2016

(65) Prior Publication Data

US 2017/0093456 A1    Mar. 30, 2017

Related U.S. Application Data

(60) Provisional application No. 62/334,686, filed on May 11, 2016, provisional application No. 62/233,238, filed on Sep. 25, 2015.

(51) Int. Cl.
*H04B 1/40* (2015.01)
*H02J 50/10* (2016.01)
(Continued)

(52) U.S. Cl.
CPC ............... *H04B 1/40* (2013.01); *H02J 50/10* (2016.02); *H02M 7/155* (2013.01);
(Continued)

(58) Field of Classification Search
CPC . H04B 1/40; H04B 1/403; H04B 1/44; H04B 5/0037; H04B 5/0093; H02J 50/05;
(Continued)

(56) References Cited

U.S. PATENT DOCUMENTS 7,211,986 B1    5/2007   Flowerdew et al.
8,461,719 B2    6/2013   Kesler et al.
(Continued)

FOREIGN PATENT DOCUMENTS

EP        2610990 EP        7/2013

OTHER PUBLICATIONS

European Search, Application No. 16157719.2 dated Jun. 28, 2016.
(Continued)

*Primary Examiner* — Thanh Le
(74) *Attorney, Agent, or Firm* — Steven W. Winn

(57) ABSTRACT

A system for harnessing and conditioning wirelessly transmitted electrical energy by near field magnetic induction configured with various magnetic field shielding embodiments is disclosed. The shielding embodiments are designed to minimize electromagnetic interference and induced electrical current. The system comprises an electrical energy capture circuit and an RF communication circuit. The electrical energy capture circuit conditions and modifies the wirelessly received electrical energy. The RF communication circuit enables the system to wirelessly communicate with its sub-circuits and other energy capture systems. The system comprises a tunable band stop filter that is electrically connected to the RF communication sub-circuit. In addition, the RF communication sub-circuit is configured with opposing electrically conductive plates that isolate and shield the circuit from an oscillating magnetic field.

35 Claims, 9 Drawing Sheets

(51) Int. Cl.
*H02M 7/155* (2006.01)
*H05K 1/02* (2006.01)
*H05K 1/11* (2006.01)

(52) U.S. Cl.
CPC ........... *H05K 1/0216* (2013.01); *H05K 1/115* (2013.01); *H05K 2201/0707* (2013.01)

(58) Field of Classification Search
CPC .......... H02J 50/10; H02J 50/12; H02M 7/155; H02M 7/17; H02M 7/19; H05K 1/0216; H05K 1/115; H05K 2201/0707
See application file for complete search history.

(56) References Cited

U.S. PATENT DOCUMENTS

| | | |
|---|---|---|
| 8,513,782 B2 | 8/2013 | Bakalski et al. |
| 8,655,272 B2 | 2/2014 | Saunamaeki |
| 8,729,679 B1 | 5/2014 | Phua |
| 2006/0069412 A1 | 3/2006 | Ginggen et al. |
| 2006/0217782 A1 | 9/2006 | Boveja et al. |
| 2008/0049409 A1 | 2/2008 | Chen et al. |
| 2009/0127934 A1 | 5/2009 | Sbuell et al. |
| 2010/0052426 A1 | 3/2010 | Carter et al. |
| 2010/0327766 A1 | 12/2010 | Recker et al. |
| 2011/0009057 A1 | 1/2011 | Saunamaki et al. |
| 2011/0190849 A1 | 8/2011 | Faltys et al. |
| 2012/0062175 A1 | 3/2012 | Miller et al. |
| 2012/0086275 A1 | 4/2012 | Chatterjee |
| 2012/0119698 A1 | 5/2012 | Karalis et al. |
| 2012/0223590 A1* | 9/2012 | Low ................ H04B 5/0037 307/104 |
| 2012/0235634 A1 | 9/2012 | Hall et al. |
| 2012/0256492 A1 | 10/2012 | Song et al. |
| 2012/0292993 A1 | 11/2012 | Mettler et al. |
| 2013/0033118 A1* | 2/2013 | Karalis ................ H02J 50/12 307/104 |
| 2013/0293027 A1 | 11/2013 | Kim et al. |
| 2014/0035378 A1 | 2/2014 | Kesler et al. |
| 2014/0044281 A1 | 2/2014 | Ganem et al. |
| 2014/0268894 A1 | 9/2014 | Shinohara et al. |
| 2014/0358195 A1 | 12/2014 | Sauer |
| 2015/0054345 A1 | 2/2015 | Monat et al. |
| 2015/0349722 A1* | 12/2015 | Wang ................ H04B 1/40 330/295 |
| 2016/0087476 A1* | 3/2016 | Carobolante ........... H02J 50/12 320/108 |
| 2017/0084991 A1* | 3/2017 | Mayo .................. H02J 50/10 |

OTHER PUBLICATIONS

Extended European Search, Application 16190695.3, dated Feb. 13, 2017.

Simard, et al., "High-Speed OQPSK and Efficient Power Transfer Through Inductive Link for Biomedical Implants", IEEE Transactions on Biomedical Circuits and Systems, vol. 4, No. 3, Jun. 2016., 192-200.

Talla, et al., "Dual Band Wireless Power and Bi-Directional Data Link for Implanted Devices in 65 nm CMOS", Dept. of Electrical Engineering and Dept. of Computer Science and Engineering, University of Washington, Seattle, USA, IEEE, May 25, 2016., 658-661.

* cited by examiner

PROTECTING WIRELESS COMMUNICATION COMPONENTS IN A HIGHLY RESONANT FIELD

CROSS-REFERENCE TO RELATED APPLICATIONS

This application claims priority from U.S. Provisional Patent Application Ser. No. 62/233,238, filed Sep. 25, 2015 and 62/334,686, filed May 11, 2016.

FIELD OF THE INVENTION

The present invention relates to a circuit for capturing wirelessly transmitted electrical energy. In particular, the invention relates to a circuit for capturing wirelessly transmitted electrical energy and configured to shield the circuit from electromagnetic interference (EMI).

PRIOR ART

It is often desirable to be able to power a portable electronic device without the need for a traditional electrical power cable that connects the device to an electrical power outlet. Electrical power cords tether devices and restrict their movement. Therefore, entangled power cords could cause confusion as to what cord is connected to a particular device and further delay in untangling the cords. These problems are particularly problematic when powering medical devices, such as electrically powered surgical tools that are used in an operating room environment.

One such way of providing electrical power to a device or an energy storage device is by using near field resonant inductive coupling to wirelessly transfer electrical energy to directly power the device or recharge an energy storage device. In near field resonant inductive coupling, electrical energy is transferred wirelessly between two resonators that are tuned to resonate at about the same frequency. The first or source resonator, is electrically connected to a power supply and the second or receiving resonator, is positioned a distance from the source resonator. When the two resonators resonate, an oscillating magnetic field between the two is created that enables transfer of electrical energy therebetween. More specifically, near field resonant inductive coupling typically uses coupled electromagnetic resonators with long-lived oscillatory resonant modes to transfer electrical power. Near field resonant inductive coupling is further discussed in U.S. Pat. No. 8,461,719 to Kesler et al.

Electrical systems that utilize near field resonant inductive coupling are often configured with radio frequency (RF) telemetry communication, which is used by the system to wirelessly communicate with its sub-circuits or with other nearby electrical systems. Such RE telemetry typically utilizes a separate RF antenna that operates at a wireless frequency in the Gigahertz range, for example about 2.4 GHz. Near field resonant inductive coupling utilizes magnetic fields that oscillate at relatively low frequencies ranging from about 100 kHz to about 10 MHz. However, such magnetic field frequencies may interfere with the operation of the RE telemetry and, in some cases, may damage the electrical components that comprise the electrical system.

The oscillating magnetic field required by near field resonant inductive coupling may cause electromagnetic interference (EMI) with the RF antenna. As such, an electromagnetic force (EMF) can be produced which may result in the induction of electrical current through the RF telemetry antenna and into the communication sub-circuit and electrical system. The oscillating magnetic field may couple with the RF antenna, thus causing electrical currents along various sections of the RF antenna. The induced electrical current generated by the interaction of the RF antenna within the oscillating magnetic field may result in the incorrect operation of the electrical system or may damage the electrical components of the electrical system.

RF telemetry antennas generally comprise monopole antennas. A monopole antenna typically comprises a strip of metal having a length that is equal to about one quarter of the wavelength of the signal that is received and transmitted. The signal wavelength ($\lambda$) is defined by the following equation:

$$\lambda = \frac{c}{f}$$

where c is the speed of light and f is frequency of the signal. A 2.4 GHz signal has a wavelength that is about five inches. Thus, a monopole RF telemetry antenna configured to transmit and receive a 2.4 GHz signal has a length of about 1.25 inches, which is adequate to interfere with the oscillating magnetic fields. In addition, monopole antennas are often configured with a piece of metal attached to the antenna's distal end. The added metal generally increases the capacitance of the antenna and results in improved transmit and receiving efficiencies. This antenna configuration is generally referred to as a "top hat" antenna because the addition of the second piece of metal, at the antenna distal end, resembles a top hat. The top hat monopole antenna design, while generally more efficient than a standard monopole antenna, is, however, generally susceptible to receiving low frequency signals, such as those at the frequency of an oscillating magnetic field.

In addition, top hat monopole antennas are capable of receiving electrical current at frequencies at which the signal wave length is greater than ten times the length of the antenna. Thus, at frequencies typically used for magnetic inductive coupling, i.e., 6.78 MHz, the wavelength of the magnetic field is about 1,742 inches. This is significantly greater than ten times the length of the RF telemetry antenna, having a length of about 1.25 inches and that is configured to send and receive a 2.4 GHz communication signal. Therefore, RF telemetry antennas, particularly top hat monopole RF antennas designed for telemetry in the Gigahertz frequency range, are susceptible to receiving electrical current at frequencies used in inductive magnetic coupling energy transfer. Such electrical currents received by the RF antenna could over load the electrical system, thereby potentially causing the system to malfunction or result in damage to the components therewithin.

Therefore, there is a need to shield the electrical sub-circuits and electrical system that utilize near field resonant inductive coupling from an oscillating magnetic field, thereby preventing an induced electrical current from entering the electrical system and its internal circuitry. The present invention, therefore, addresses this need by providing electrical circuitry and magnetic field shielding that is positioned in and around the internal electrical sub-circuits of the system.

One such solution is to incorporate electrical circuitry configured to minimize or prevent an electrical current from being induced within the electrical system. In an embodiment, at least one band stop filter that specifically tuned to the frequency or frequencies of an oscillating magnetic field is electrically connected to the internal circuitry, such as the communication sub-circuit, comprised within the electrical system of the present invention. Electrically incorporating a band stop filter with the communication sub-circuit within the wireless energy capture system minimizes electromagnetic interference (EMI) and prevents an induced electrical current from entering the system.

A second solution is to electrically shield or isolate at least one of the various electrical sub-circuits of the electrical system from a surrounding oscillating magnetic field. Thus, electromagnetic interference and an induced electrical current is minimized or prevented from entering the system. In another embodiment, magnetic field shielding is positioned around the electrical sub-circuits within the system. This shielding isolates the internal circuitry and prevents interaction of the internal circuitry with a surrounding magnetic field that might otherwise cause undesirable electromagnetic interference (EMI).

SUMMARY OF THE INVENTION

The present invention discloses various embodiments that minimize or prevent electromagnetic interference caused by the interaction of electrical components of an electrical system with an oscillating magnetic field. Specifically, the present invention provides various embodiments that shield an RF telemetry communication circuit from oscillating magnetic fields that are utilized to capture electrical energy by near field magnetic resonant coupling.

In one embodiment, at least one resonant band stop filter or notch filter is electrically connected to an RF communication antenna and RF communication sub-circuit within an electrical system. The band stop filter or notch filter is configured to attenuate electrical current flow or electrical power at a selected frequency or range of frequencies of the surrounding oscillating magnetic field. For example, for a near field magnetic resonant coupling system operating at 6.78 MHz, the novel band stop filter of the present invention can be designed to resonate at a frequency of 6.78 MHz to thus create an open circuit in the RF communication sub-circuit at that selected frequency. As a result, induced electrical power or electrical current at that select frequency is prevented from entering the communication sub-circuit and electrical system. It will be obvious to those skilled in the art that all of the embodiments described herein are equally applicable to a wide range of electrical systems that are configured for use with near field resonant magnetic coupling, including but not limited to, near field resonant magnetic coupling energy capture systems, near field resonant magnetic coupling configured battery packs, and electrical circuits configured to directly power a device.

Since near field magnetic coupling is dependent upon producing very large oscillating magnetic fields that operate at discrete frequencies, this is an ideal situation for a specific band stop filter or notch filter. A band stop filter attenuates or prevents frequencies between two non-zero finite limits and passes all frequencies not within those limits. A notch filter is a band stop filter that attenuates a narrow frequency band. Band stop filters are more efficient for eliminating one single frequency than broadband filters. In addition, because band stop filters target one frequency or a range of frequencies, the filter is typically smaller and volumetrically efficient.

A band stop filter comprises a capacitor in parallel with an inductor, the parallel capacitor and inductor combination is placed in electrical series with the RF communication antenna and communication sub-circuit wherein the values of capacitance and inductance are selected such that the band stop filter is tuned to resonate at a select oscillating frequency or range of frequencies of the surrounding oscillating magnetic field. Once the band stop filter is configured to resonant at the frequency of the magnetic field, the filter will attenuate or prevent conduction of electrical current or electrical power induced at that frequency within the circuit and electrical system. Thus, the possibility that the circuit may become electrically overloaded from induced electrical current is minimized.

In another embodiment, a magnetic field shielding structure is provided that prevents the interaction of the magnetic field with the internal circuitry of the electrical system. In an embodiment, a circuit board that supports internal circuitry, such as the communication sub-circuit within the electrical system, is positioned between two opposing electrically conductive plates. A series of vias extending through the circuit board electrically contact the opposing top and bottom plates thereby creating a Faraday cage that isolates the circuit board from a surrounding oscillating magnetic field. In an embodiment, the vias that extend through the circuit board of the communication sub-circuit are preferably spaced apart such that they create a series of apertures or gaps having a width that is less than one half the wavelength of the wavelength of the magnetic field that is intended to be blocked.

Thus, the present invention provides for an electrical circuit and shielding structure that minimizes or prevents electrical magnetic interference (EMI) generated by magnetic fields that oscillate at frequencies utilized in near field magnetic resonant coupling.

These and other objects of the present invention will become increasingly more apparent to those skilled in the art by reference to the following description and to the appended drawings.

DETAILED DESCRIPTION OF THE PREFERRED EMBODIMENTS

Figure 1:
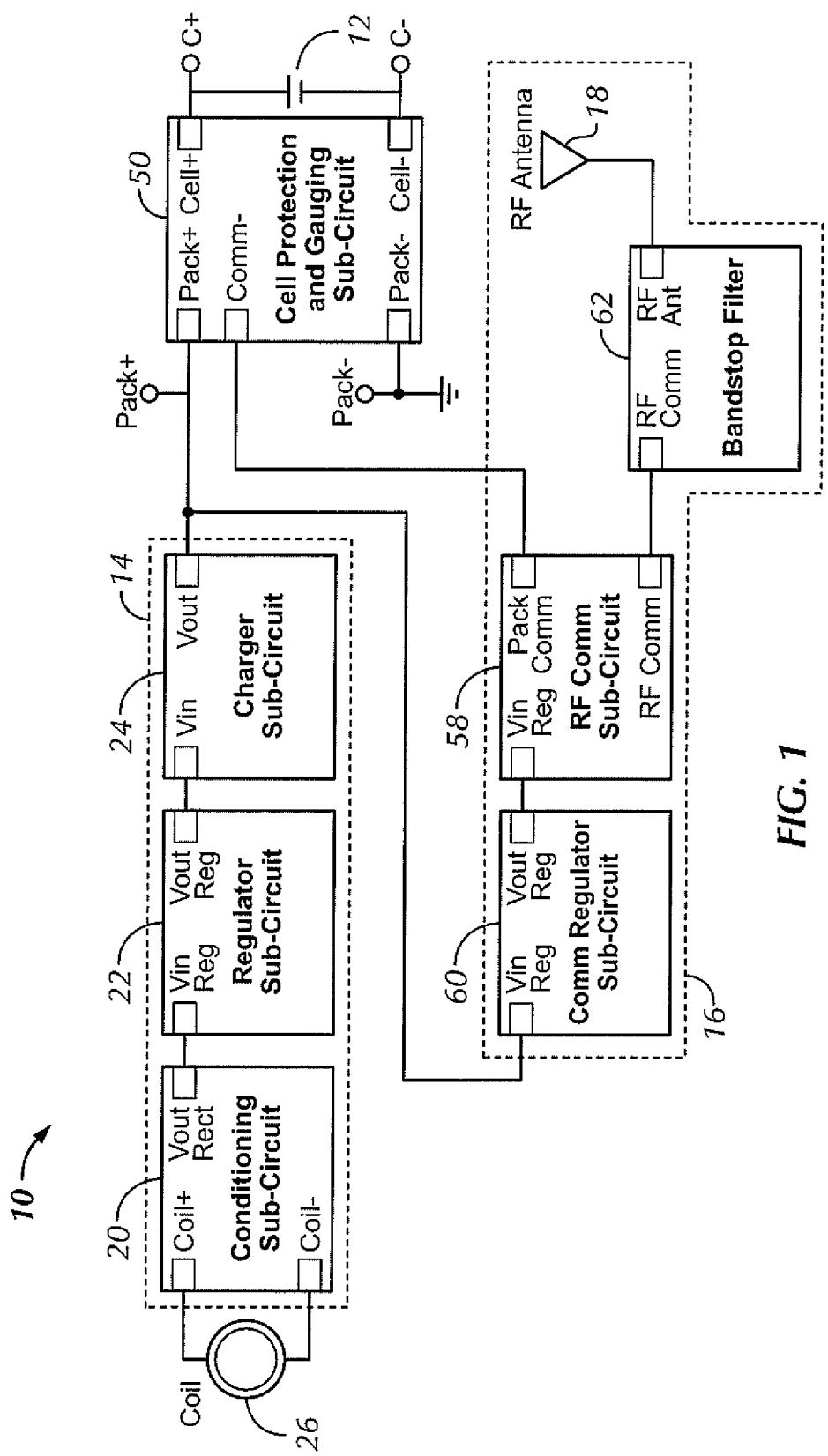
FIG. 1 is an electrical schematic diagram of an embodiment of a wireless energy capture system of the present invention.

In an embodiment, the present invention provides an energy capture system 10 that is designed to utilize near field resonant inductive coupling to wirelessly capture alternating current electrical energy. The captured electrical energy may be used to recharge at least one electrical energy storage device 12, such as an electrochemical cell or battery pack that is electrically connected to the system 10 or, alternatively, the system may be used to directly power a device (not shown). In a preferred embodiment, the system 10 has an energy capture circuit 14 and a communication circuit 16. The communication circuit 16 has a separate communication antenna 18 that enables wireless communication in the radio frequency (RF) range (1 GHz to about 10 GHz) between the various sub-circuits that comprise the system 10, in addition to other energy capture systems.

The energy receiving circuit 14 captures and converts wirelessly transmitted electrical energy so that this energy can be used to recharge the energy storage device 12 that is attached thereto. The energy capture system 10 may be positioned on an exterior surface of an energy storage device 12 or, alternatively, it may be electrically incorporated within the structure of an energy storage device. Likewise, the energy capture system 10 may be positioned on an exterior surface of a device or, alternatively, the system 10 may be electrically connected within the device.

As defined herein, an electrical energy storage device is an apparatus that is capable of repeatably storing electrical energy. An electrochemical cell is a device capable of generating electrical energy from a chemical reaction. A "battery pack" comprises a plurality of at least two electrochemical cells that are electrically connected together to provide an electrical power source. In a preferred embodiment the electrochemical cell or battery pack comprises at least one rechargeable or secondary electrochemical cell. As defined herein, "charge power" is the electrical power emitted by the charging system to charge an electrical energy storage device, such as an electrochemical cell or battery pack. "Charge current" is the electrical current that is emitted by the charging system to charge a cell. "Charge voltage" is the electrical voltage that is emitted by the charging system to charge a cell. "Charge power" (P) is equal to charge voltage (V) multiplied by charge current (I).

In an embodiment, electrical energy received wirelessly by the energy capture system 10 of the present invention is used to charge a secondary electrochemical cell or battery pack. Such secondary electrochemical cells may include, but are not limited to, electrochemical chemistries such as lithium ion (Li-ion), lithium ion polymer (Li-ion polymer), nickel metal hydride (NiMH), nickel cadmium (NiCd), and lithium iron phosphate (LiFePO$_4$). In a preferred embodiment, the energy capture system 10 of the present invention may be used to charge cells and power packs requiring from about 1 milliwatts to about 500 kilowatts of electrical power.

Specifically in wireless electrical power transfer using near-field resonant inductive coupling, a source resonator or transmitting coil is electrically connected to an electrical power generator with direct electrical connections. A receiving resonator, or receiving coil positioned a distance from the source resonator is electrically connected to a load (i.e., a device) with direct electrical connections. The source and receiving resonators are coupled via a magnetic field therebetween to exchange electrical energy wirelessly between the source and the receiving resonators in order to transmit electrical power from the power generator to the device.

A resonator may be constructed such that the energy stored by the electric field is primarily confined within the resonator structure and energy stored by the magnetic field is primarily in the region surrounding the resonator. Thus, the electrical energy exchange is mediated primarily by the resonant magnetic near-field surrounding the space about the resonators. The resonator, sometimes referred to as a "coil", is generally constructed by wrapping a metallic wire around a core of magnetic material. Additional information about resonators utilized in near field resonant induction power transfer can be found in U.S. patent application publication no. 2012/0235634 to Hall et al.

Figure 2:
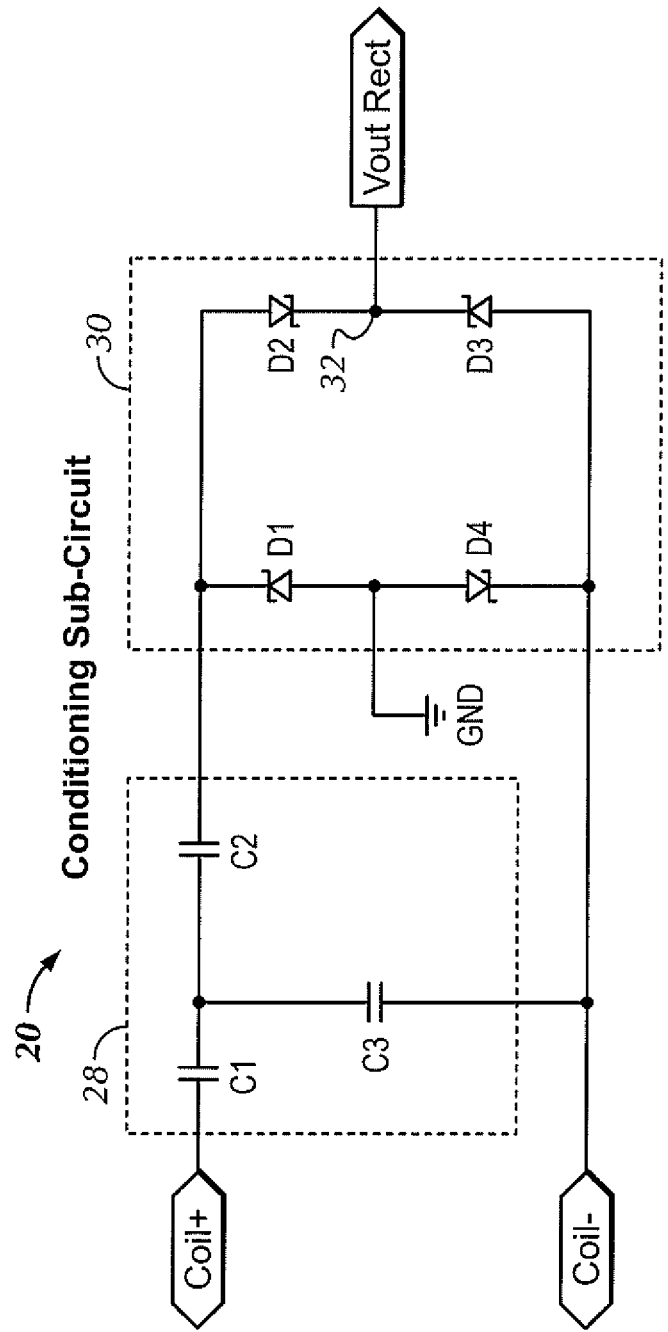
FIG. 2 shows an electrical schematic diagram of an embodiment of a voltage conditioning sub-circuit.
Figure 3:
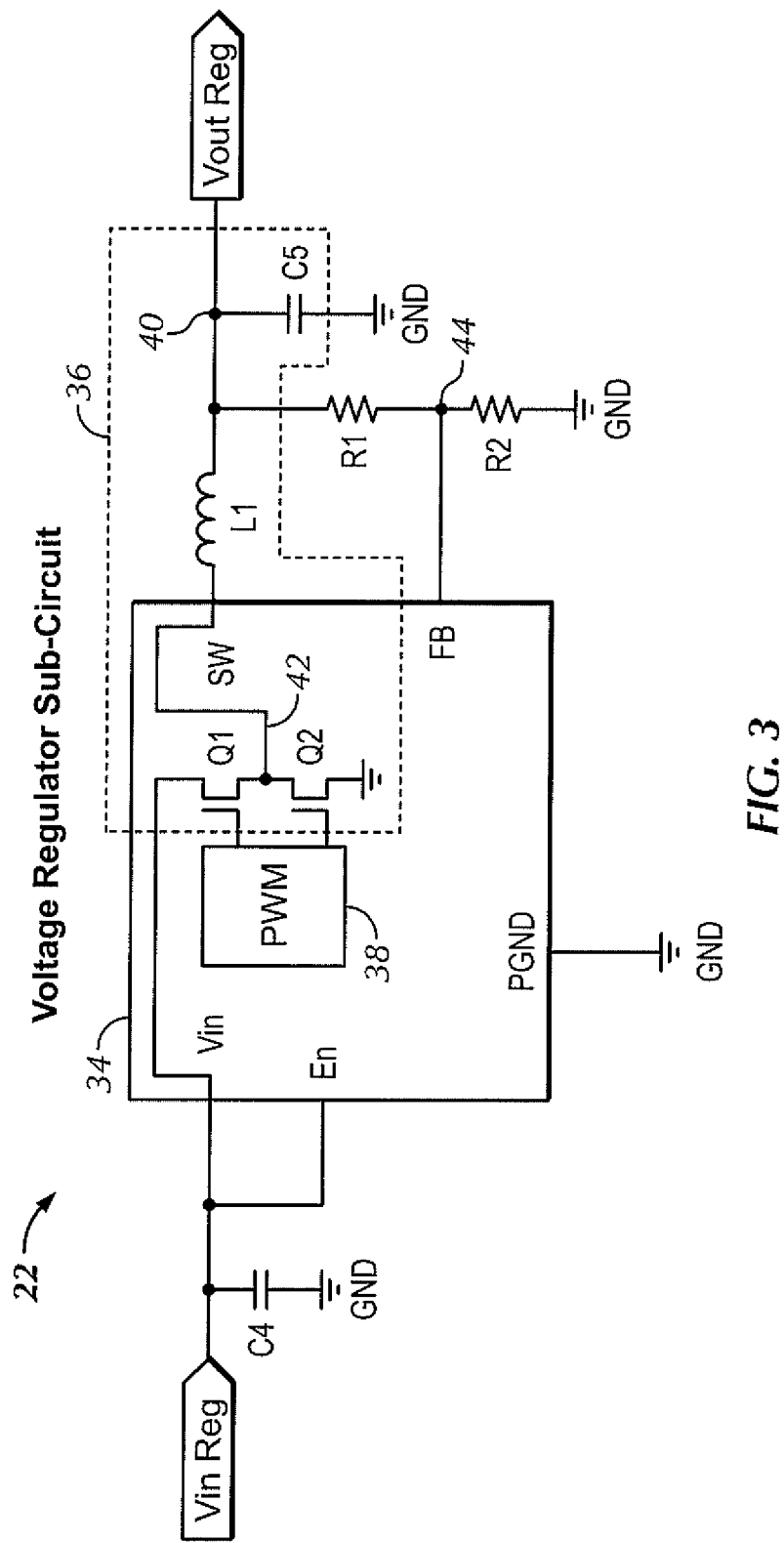
FIG. 3 is an electrical schematic diagram of an embodiment of a voltage regulator sub-circuit.
Figure 4:
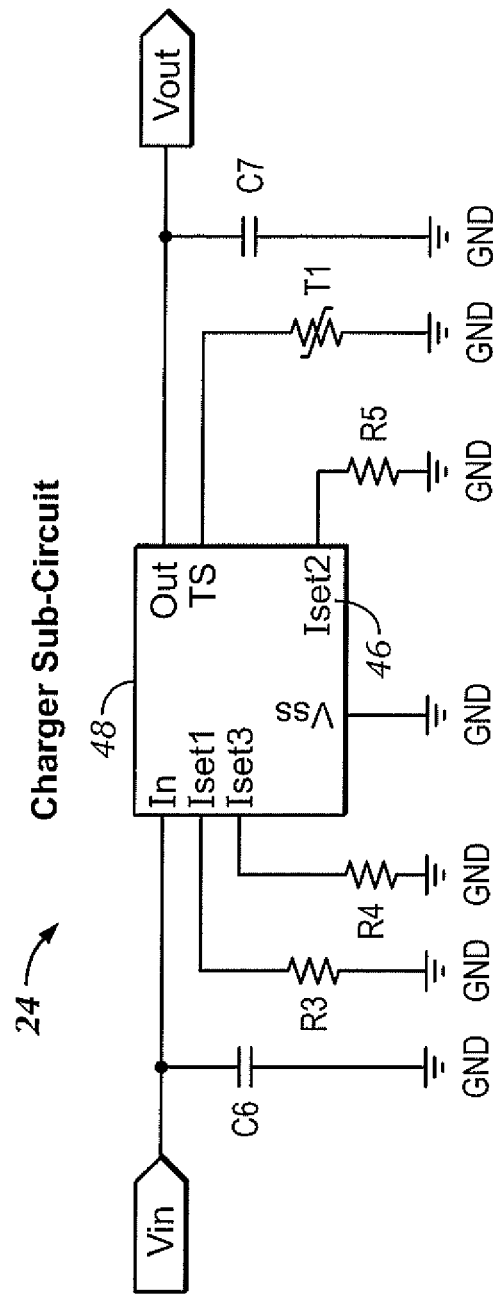
FIG. 4 is an electrical schematic diagram of an embodiment of a charger sub-circuit.
Figure 5:
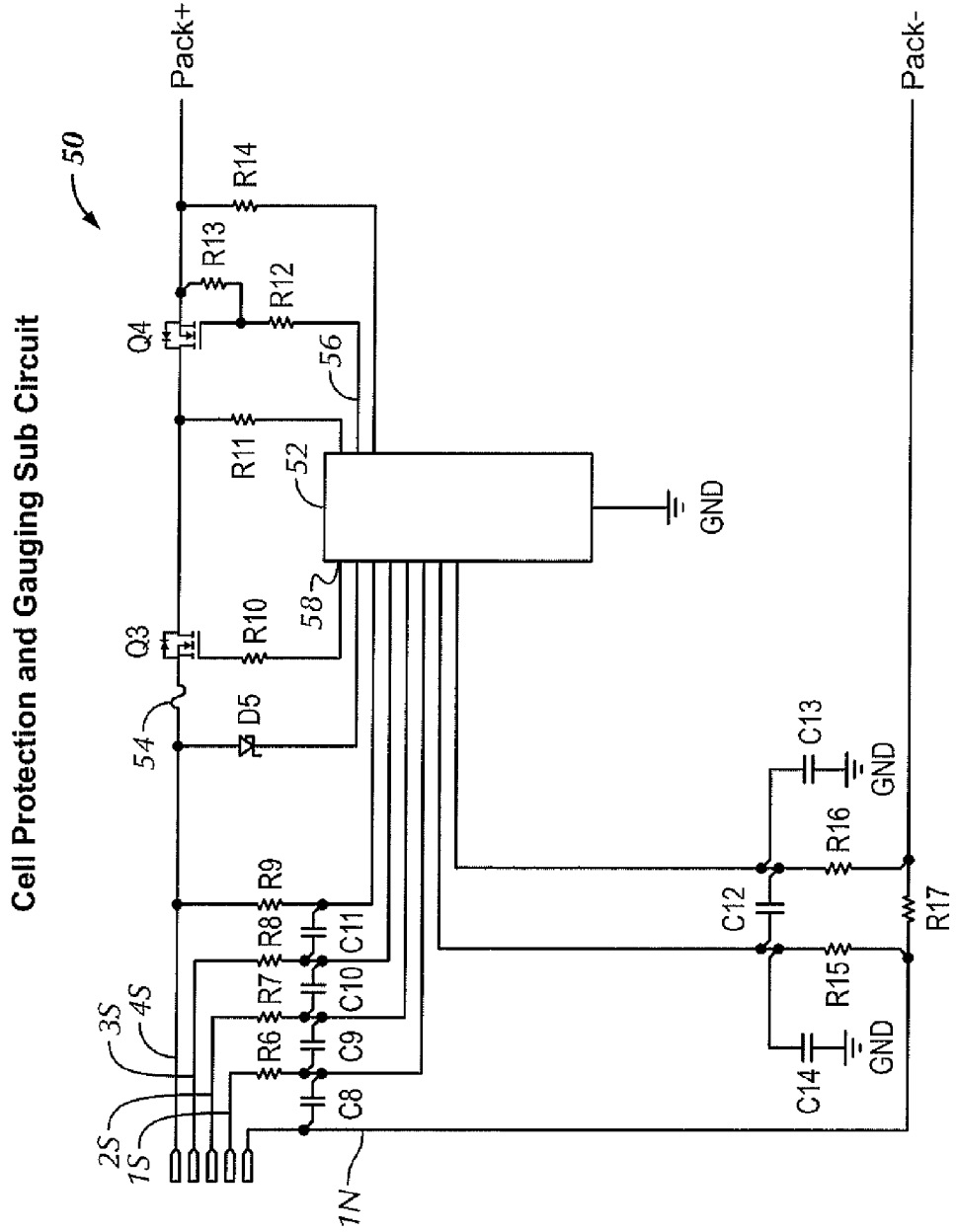
FIG. 5 shows an electrical schematic diagram of an embodiment of a cell protection and gauging sub-circuit.
Figure 6:
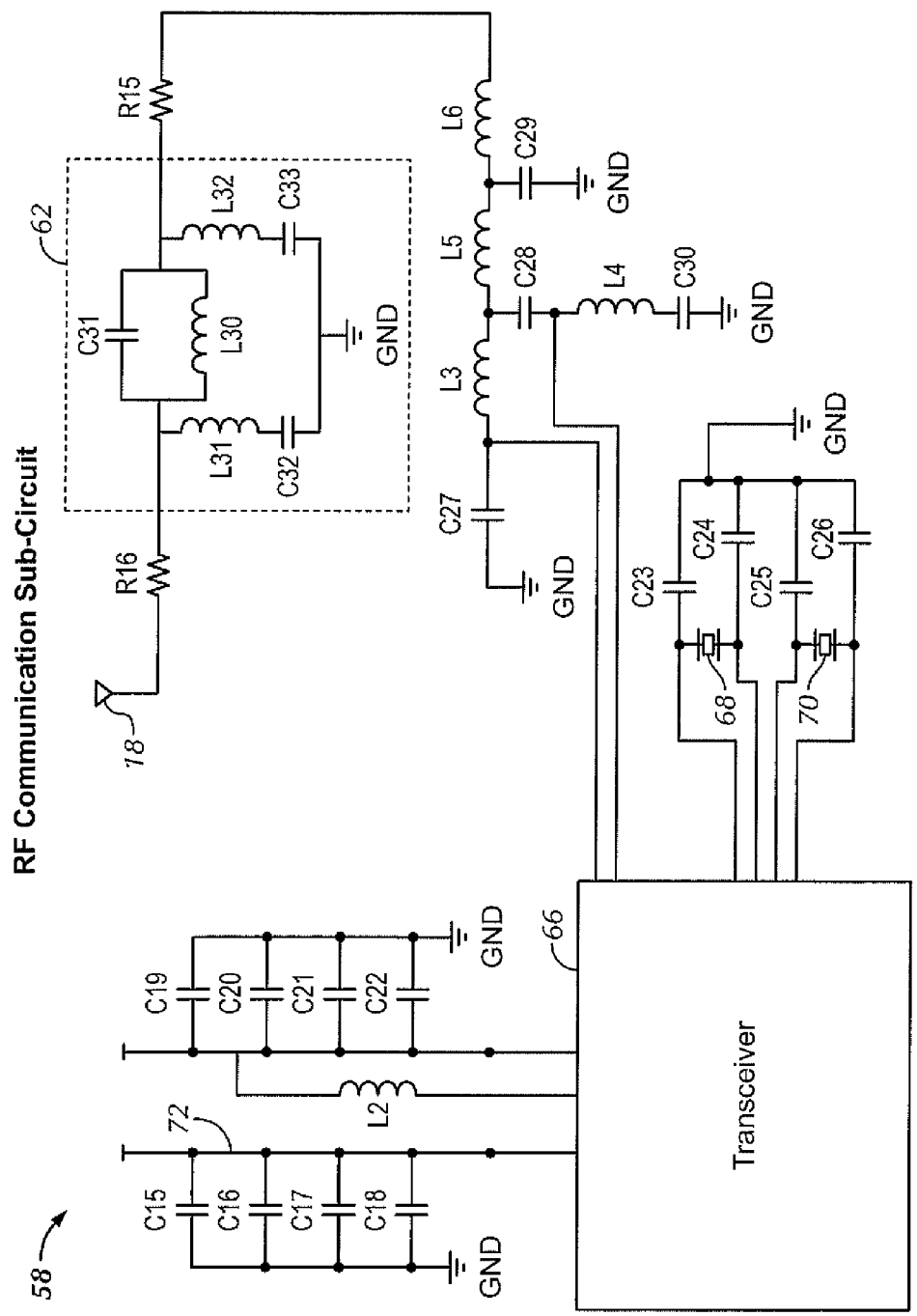
FIG. 6 is an electrical schematic diagram of an embodiment of a radio frequency (RF) communication sub-circuit.
Figure 7:
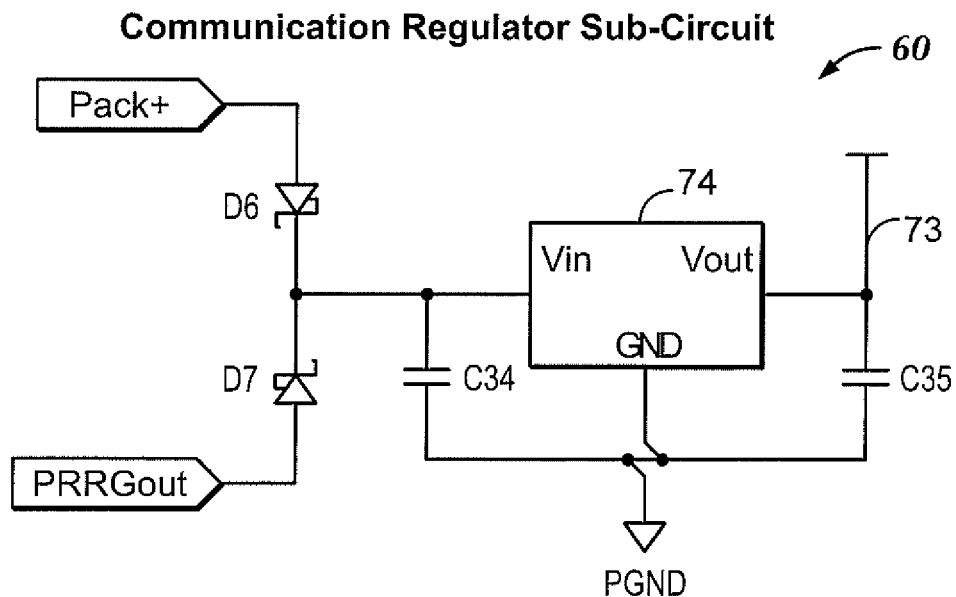
FIG. 7 shows an electrical schematic diagram of a communication circuit voltage regulator sub-circuit.

Now turning to the figures, FIGS. 1-7 illustrate embodiments of electrical schematic diagrams of the various circuits that comprise the energy capture system 10 of the present invention. FIGS. 2-4 illustrate electrical schematic diagrams of the sub-circuits that comprise the energy capture circuit 14 of the energy capture system 10. FIGS. 6 and 7 are electrical schematic diagrams that comprise the RF communication circuit that is electrically connected to the energy capture circuit 14 within the energy capture system 10.

The energy capture circuit 14, as illustrated in FIGS. 2-4, is designed to receive and modify electrical power that is wirelessly transmitted from a transmitting coil (not shown) using near field resonant magnetic coupling. More specifically, the electrical energy capture circuit 14 of the present invention is designed to harness and condition wirelessly transmitted electrical power having an alternating current (AC) for use in charging an electrochemical cell or battery pack with direct current (DC) electrical power.

As illustrated in FIG. 1, the energy capture circuit 14 comprises an electrical energy conditioning sub-circuit 20, a voltage regulator sub-circuit 22, and a charger sub-circuit 24. A wireless energy receiving antenna or coil 26 is electrically connected to the energy conditioning sub-circuit 20. In an embodiment, the energy capture circuit 14 is designed to harness and convert an electrical power having an alternating current (AC) that is transmitted wirelessly from a transmitting coil (not shown) into electrical power having a direct current that is used to re-charge an electrochemical cell 12. Alternatively, the energy capture circuit 14 could be used to capture and condition the wirelessly received electrical energy to directly power a device (not shown). More specifically, the electrical energy capture circuit 14 is designed to receive and modify an alternating current electrical power that is transmitted wirelessly via near field resonant inductive coupling such that the modified electrical power can be used to recharge an energy storage device 12, such as an electrochemical cell or battery pack or, alternatively, directly power a device.

FIG. 2 illustrates an electrical schematic diagram of an embodiment of the electrical energy conditioning sub-circuit 20. The conditioning sub-circuit 20 is designed to capture and modify alternating current electrical power that is transmitted wirelessly via near field resonant inductive coupling and convert that alternating current into direct current (DC) electrical power.

As shown, the electrical energy conditioning sub-circuit 20 comprises a matching electrical impedance circuit 28 and a rectification circuit 30. The conditioning sub-circuit 20 serves to convert wireless electrical power received by the receiving coil 26 of the energy receiving circuit 14 from an alternating current electrical power to a direct current electrical power for use in charging an energy storage device 12. The electrical impedance matching or network circuit 28 is electrically connected to the rectification circuit 30. The impedance matching circuit 28 is designed to adjust and match the electrical impedance of the receiving coil 26 to a characteristic impedance of the power generator or the load at a driving frequency of the source or transmitting first resonator (not shown). In general, the efficiency and amount of electrical power delivered between the transmitting coil and a receiving coil is largely dependent on the impedances of the respective inductive elements of the transmitting coil and receiving coil relative to the electrical properties of the device to which the receiving coil is connected thereto. Therefore, the impedance-matching network circuit 28 is designed to maximize the efficiency of the electrical power delivered between the source resonator (not shown) and the receiving second coil 26.

As illustrated, the impedance matching network circuit 28 comprises a series of capacitors $C_1$-$C_3$ that are arranged to actively adjust and match the electrical impedance of the receiving resonator 26 to the electrical impedance of the transmitting resonator and connected electrical power source. It is noted that some capacitors may be added or removed to achieve optimal impedance match.

The captured wireless electrical power passes from the matching network circuit 28 to the rectification circuit 30. In a preferred embodiment, the rectification circuit 30 modifies the electrical current of the received electrical power from an alternating current to a direct current. In a preferred embodiment illustrated in the electrical schematic of FIG. 2, the rectification circuit 30 comprises a series of diodes, $D_1$-$D_4$. After the wireless electrical power is modified by the matching network circuit 28 and the rectification circuit 30, the electrical power exits the conditioning sub-circuit 20 at node 32.

The rectified electrical power is then directed to the voltage regulator sub-circuit 22 and the charging sub-circuit 24 where the voltage of the electrical power is modified. The voltage regulator sub-circuit 22 modifies the amplitude of the voltage of the incoming electrical power so that it can be used to charge the energy storage device or, directly power a device. In an embodiment, the voltage regulator sub-circuit 22 comprises a voltage regulator that modifies the amplitude of the voltage of the incoming electrical power. The voltage regulator is selected based on the cell being re-charged or the device being powered. In an embodiment, the voltage regulator sub-circuit 22 may comprise a step-down voltage regulator that reduces the amplitude of the voltage of the captured electrical power. Alternatively, the voltage regulator sub-circuit 22 may comprise a step-up voltage regulator that increases the amplitude of the voltage of the captured electrical power.

FIG. 3 illustrates an embodiment of the electrical schematic diagram of the voltage regulator circuit 22. As shown, the circuit 22 comprises a first integrated circuit 34 that is capable of modifying the amplitude of the voltage of the incoming electrical power. In a preferred embodiment, the first integrated circuit 34 comprises a synchronous buck voltage converter 36 having a first and second field emission transistors (FET) $Q_1$ and $Q_2$, inductor $L_1$ and capacitor $C_5$. In addition, a first pulse width modulator (PWM) 38 is electrically incorporated within the first integrated circuit 34. The first PWM 38 preferably controls operation of the buck converter 36 and the resulting amplitude of the voltage of the electrical power that exits the voltage regulator circuit 22 at node 40. The synchronous buck converter 36 is preferred because it is capable of efficiently modifying the amplitude of a voltage without generating a significant amount of heat. In an embodiment, the regulator sub-circuit 22 of the energy capture circuit 14 of the present invention is capable of reducing the amplitude of the voltage of a received input electrical power from about 10 to 40 volts to about 5V without generating a significant amount of heat. Use of the buck converter 36 is ideal since the wirelessly configured energy storage devices 12 may receive wireless electrical power having voltages greater than 20V or 30V. Heat generation resulting from reducing the amplitude of voltage of such magnitude is not desired as such heat could adversely affect an energy storage device 12, particularly lithium ion electrochemical cell and battery packs. In addition, the regulator sub-circuit 22 comprising the buck converter 36 is designed to accommodate a larger amount of electrical energy on the order of about 50-100 W. Since the magnitude of the received electrical power is a function of the orientation of the energy capture circuit 14 with the transmitting coil 26, the energy capture circuit 14 could receive electrical energies having increased power on the order of 50-100 W, or more. Thus, the regulator sub-circuit 22 having the buck converter 36 allows variation in the magnitude of the received wireless electrical power due to the orientation of the energy capture circuit 14 with respect to the transmitting coil.

In an embodiment, the first PWM 38 works in conjunction with the buck converter 36 to modify the amplitude of the output voltage of the voltage regulator circuit 22 by comparing the output voltage at node 42 to a reference voltage measured at node 44. The reference voltage is established at node 44 by resistors $R_1$ and $R_2$ that are connected in electrical series. The reference voltage is measured at the voltage feedback pin (FB) by the first PWM 38 which thus controls operation of the buck regulator 36 to appropriately reduce the amplitude of the voltage output of the electrical power. In addition to the first integrated circuit 34, the voltage regulator sub-circuit 22 also comprises an LC filter which comprises inductor $L_1$ and capacitor $C_5$. Capacitor $C_4$ serves as a filter for the sub-circuit 22. In a preferred embodiment, the first integrated circuit 34 is configured to always be in an enabled or "on" configuration. This allows the incoming electrical power from node 32 of the conditioning sub-circuit 20 to always be received by the first integrated circuit 34 of the voltage regulator sub-circuit 22.

FIG. 4 illustrates an embodiment of the charging sub-circuit 24 that resides within the energy capture circuit 14 of the wireless energy capture system 10 of the present invention. As shown, the charging sub-circuit 24 comprises a second integrated circuit 46 that acts as a voltage regulator to further modify the amplitude of the voltage of the incoming electrical power after the voltage of the electrical power is initially reduced by the voltage regulator sub-circuit 22. In an embodiment, the charging sub-circuit 24 fine tunes the amplitude of the voltage within about +/−2 V such that it can be optimally utilized to charge the energy storage device 12 or directly power a device. In a preferred embodiment, the second integrated circuit 46 comprises a linear voltage regulator 48 electrically incorporated therewithin. The linear voltage regulator 48 is capable of making fine adjustments to the amplitude of the voltage of the incoming power. The ability to make relatively small adjustments to the amplitude of the voltage of the charging electrical power is particularly ideal for re-charging lithium secondary cells having a relatively small size. The voltage of such secondary cells may vary only by about 2V or less during use thus, it is ideal to use a linear voltage regulator that is capable of making small incremental adjustments to the magnitude of the voltage. However, linear voltage regulators are generally known to generate heat. The heat generated by a linear voltage regulator is proportional to the magnitude of the voltage adjustment. Thus, for example, reducing the amplitude of a voltage from about 30 or 40 volts to about 5 volts generates more heat as compared to reducing the amplitude of a voltage from about 10 V to about 5 V. Since electrochemical cells, particularly lithium ion secondary cells of a relatively small size are generally adversely affected by heat generation, the energy capture circuit 14 preferably comprises a combination of the buck converter 36 incorporated within the voltage regulator sub-circuit 22 and the linear voltage regulator 48 incorporated within the charger sub-circuit 24. The buck converter 36 acts as a pre-voltage regulator that it efficiently modifies the voltage of the incoming electrical power such that it can be more easily managed by the linear voltage regulator 48 without generating a significant amount of undesirable heat.

In an embodiment, the charging sub-circuit 24 establishes the charge rate of the energy storage device 12. In an embodiment, the charging sub-circuit 24 is capable of modifying the charge rate based on the state of voltage of the energy storage device 12, the temperature of the energy storage device 12, and combinations thereof. The second integrated circuit 46 is generally capable of modifying the charge rate based on the voltage state of the cell and cell temperature. In a preferred embodiment, the second integrated circuit 46 comprises voltage sensors $Iset_1$, $Iset_2$, and $Iset_3$ which respectively establish the current charge set point based on the dynamic measurement of the state of voltage of the energy storage device and/or the temperature of the device measured by thermistor $T_1$. For example, if the energy storage device is determined by the second integrated circuit 46 to be within a certain state of voltage and is operating within normal temperature parameters, i.e., from about 20° C. to 35° C., a first current charge rate is utilized. However, if the energy storage device 12 is determined by the integrated circuit to be below a certain state of voltage, i.e., below about 2.8V or is operating at a temperature that is greater than a set temperature, i.e., above 35° C. to about 50° C., the current charge rate is modified to stabilize the energy storage device 12. In addition, the charging circuit comprises resistors $R_3$-$R_5$ and capacitors $C_6$ and $C_7$ which are utilized separately, or in combination, as electrical filters to stabilize the output voltage of the linear regulator 48 of the charging sub-circuit 24.

FIG. 5 illustrates an embodiment of the protection and gauging sub-circuit 50. In an embodiment, the protection sub-circuit 50 acts as a safety measure that protects the energy storage device 12 from potential damage as a result of being over-charged, over-discharged, or exceeding a set temperature during use and/or recharge. In an embodiment, the protection sub-circuit 50 protects the energy storage device 12 from becoming over-charged to a voltage state that is too high. In addition, the protection sub-circuit 50 protects the energy storage device 12 from becoming over-discharged to a voltage state that is too low. Furthermore, the protection sub-circuit 50 protects the energy storage device 12 from exceeding a set temperature during re-charge.

In an embodiment, the protection and gauging sub-circuit 50 comprises a third integrated circuit 52, field emission transistors $Q_3$ and $Q_4$, fuse 54, capacitors $C_8$-$C_{13}$ and resistors $R_6$-$R_{14}$. In a preferred embodiment, $Q_3$ and $Q_4$ act as a circuit breaker that either electrically connects or disconnects the charging current from the energy capture circuit 14 to or from the energy storage device 12. In a preferred embodiment, integrated circuit control pin 56 is used to control the operation of $Q_4$ and integrated circuit control pin 58 is used to control the operation of $Q_3$. In addition, the integrated circuit 52 preferably comprises a voltage sensor (BAT) that measures the voltage state of the energy storage device 12. For example, if the energy storage device 12 is at an under voltage state, i.e., below about 2.6 V, or at an over voltage state, i.e., greater than about 4.2 V, $Q_3$ and $Q_4$ are controlled to electrically disconnect the energy capture circuit 14 and charging current from the energy storage device 12. The protection circuit 50 also comprises capacitor $C_8$-$C_{11}$ which are utilized as electrical filters for the sub-circuit 50.

FIGS. 6 and 7 illustrate embodiments of the communication circuit 16 that is incorporated within the energy capture system 10. The communication circuit 16 enables the energy capture system 10 of the present invention to wirelessly communicate with other sub-circuits within the system 10 or, alternatively, to communicate with other energy capture systems 10. In a preferred embodiment, the communication circuit 16 enables wireless communication within a radio frequency that ranges from about 1 GHz to about 10 GHz. The RF communication provided by the communication circuit 16 operates at a significantly greater frequency than the wireless energy transfer that occurs by near field resonant magnetic field coupling between a transmitting coil (not shown) and the receiving coil 26. The wireless energy transfer that occurs by resonant magnetic field coupling occurs at a frequency that ranges from about 100 kHz to about 10 MHz. In contrast, the RF communication circuit operates in the Gigahertz range.

In an embodiment, the communication circuit 16 comprises a communication voltage regulator sub-circuit 60 and an RF communication sub-circuit 58. The RF communication sub-circuit 58, which comprises the RF antenna 18 and a band stop filter 62, is configured to generate a signal in the radio frequency range that is transmitted and received by the RF antenna 18. The communication voltage regulator sub-circuit 60 provides electrical power to operate the RF communication sub-circuit 58. The communication voltage regulator sub-circuit 60 is electrically connected to the RF communication sub-circuit 58 and the energy capture circuit 14.

In an embodiment, the RF communication sub-circuit comprises a transceiver 66 that is configured to transmit and receive an RF communication signal. In a preferred embodiment, the RF communication signal has a frequency that ranges from about 1 GHz to about 10 GHz. In addition, the communication sub-circuit 60 may comprise first and second oscillators 68, 70 and capacitors $C_{23}$-$C_{26}$ that provide a reference clock for the RF signal. As illustrated, a communication power line 72 connects the communication voltage regulator 24 to the transceiver 66. A plurality of capacitors $C_{15}$-$C_{22}$, which are electrically connected to the power line 72, decouple the voltage regulator from the transceiver 66. In addition, the RF communication sub-circuit 58 comprises capacitors $C_{27}$-$C_{30}$ and inductors $L_3$-$L_6$ that condition the RF signal to be used with the RF antenna.

As illustrated in FIGS. 1 and 6, the RF antenna 18 is electrically connected to the communication sub-circuit 60. In an embodiment, the band stop filter 62 is electrically connected in series between the RF antenna 18 and the transceiver 66 along communication signal line 73. In a preferred embodiment, the antenna 18 may comprise a single end antenna, more preferably, the antenna 18 comprises an inverted single end RF antenna that is configured to send and receive electrical signals in the Gigahertz frequency range.

The band stop filter 62 is configured to attenuate or block an induced electrical power or electrical current that may result from electromagnetic interference between a magnetic field oscillating at a near-field resonant magnetic coupling frequency and the RF antenna 18. Thus, the band stop filter 62 significantly minimizes induced electrical current caused by electromagnetic forces acting on the RF antenna 18 in the presence of an alternating magnetic field that may otherwise enter the communication circuit 14 and the energy capture system 10. As shown the band stop filter 62 is configured such that inductors $L_{31}$, $L_{32}$, and capacitors $C_{32}$ and $C_{33}$ are electrically connected in series. In addition, capacitor $C_{31}$ and inductor $L_{30}$ are electrically connected in parallel with inductors $L_{31}$, $L_{32}$ and capacitors $C_{32}$, $C_{33}$. The band stop filter 62 may be tuned to selectively attenuate frequencies by selecting combinations of capacitors $C_{31}$-$C_{32}$ and inductors $L_{30}$-$L_{32}$ having specific capacitance and inductance values.

FIG. 7 illustrates an embodiment of the electrical schematic diagram of the communication voltage regulator sub-circuit 60. The circuit is configured to modify the voltage that is used to power the communication sub-circuit 58. In an embodiment, the circuit comprises a fourth integrated circuit 74 that is used to modify the amplitude of the voltage of the electrical power used by the communication sub-circuit 60. In addition to the integrated circuit 74, the sub-circuit 60 comprises diodes $D_6$, $D_7$ which act as electrical switches within the sub-circuit and capacitors $C_{34}$ and $C_{35}$ which act as electrical filters.

Figure 8:
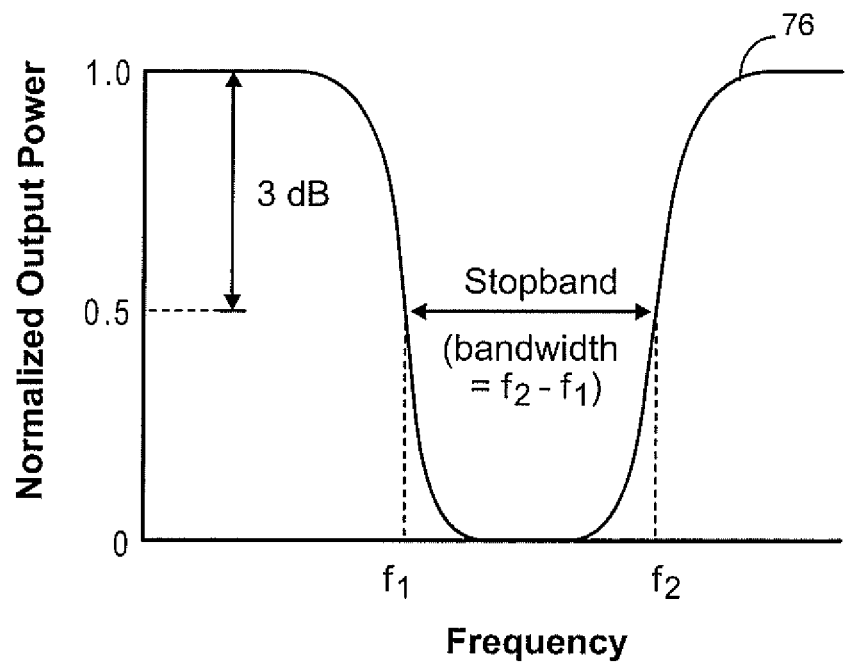
FIG. 8 shows an exemplar signal that has been attenuated using a band stop filter.

FIG. 8 illustrates a generic embodiment in which a signal 76 has been attenuated by a band stop filter. As shown, the signal 76 has been attenuated between frequencies $f_1$ and $f_2$ which defines a bandwidth along the x axis. The bandwidth is typically between frequencies $f_1$ and $f_2$ at the 3 dB loss points as measured on the attenuation graph (FIG. 8). The 3 dB bandwidth determines how sharply the filter will rise and fall. The magnitude of attenuation, given in decibels (dB), is provided on the y-axis. A non-attenuated signal 76 has a normalized power output of 1. A fully attenuated signal has a magnitude of 0. As illustrated, as the signal is attenuated by the band stop filter 62, the magnitude of the signal 76 decreases. As shown, an attenuation of 3 dB reduces the initial magnitude of the signal by 50%. The greater the magnitude of attenuation, the greater the amount of signal that is prevented from passing through. In an embodiment, both the magnitude of attenuation and frequency width may be adjusted by selecting capacitors and inductors having different capacitances and inductances, respectively.

Figure 9:
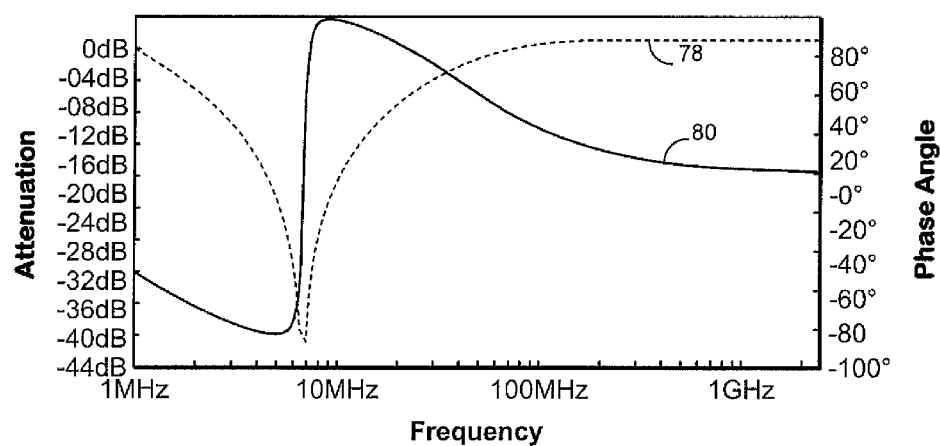
FIG. 9 shows an example of an attenuated signal at 6.78 MHz using the band stop filter electrically connected to the RF communication sub-circuit.

FIG. 9 illustrates an attenuated signal 78 having a center attenuated frequency of about 6.78 MHz. As shown, the signal 78 has been attenuated to about −40 dB or about 99% of its initial magnitude. In an embodiment, the signal 78 may be an electrical power signal, an electrical current signal or an electrical voltage signal that is attenuated by the band stop filter 62. In addition, the configured band stop filter 62 has caused the phase 80 of the signal 78 to shift by 90° so that the signal is out of phase and substantially attenuated. It is noted that FIG. 9 is a plot of attenuation in relation to the transmitted signal, in effect showing the "gain" of the band stop filter 62. In an embodiment, FIG. 9 is a plot of attenuation of electrical power (Watts) at a given frequency. For example, given a band stop filter 62 configured to exhibit the response shown in FIG. 9, a signal 78 having an electrical power of 1 W and a frequency of 6.78 MHz would be attenuated to 0.0.001 W, thereby minimizing the potential impact of the electrical current on the communication sub-circuit 58 and electrical system 10 of the present invention.

In an embodiment, capacitors $C_{31}$-$C_{32}$ and inductors $L_{30}$-$L_{32}$ of the band stop filter 62 (FIG. 6) may be selected to attenuate electrical current induced by a magnetic field that oscillates at frequencies ranging from about 100 kHz to about 13.56 MHz. Table I details exemplary combinations of capacitors and inductors having various capacitance and inductance values that may be incorporated within the band stop filter 62, as shown in FIG. 6. These exemplary capacitor and inductor combinations are configured to attenuate electrical current induced by an electromagnetic force caused by interaction of the RF antenna 18 with a surrounding osculating magnetic field having a center frequency that ranges from 250 kHz to 13.56 MHz.

TABLE I

| Center Freq. (Hz) | $C_{32}$ (F) | $L_{31}$ (H) | $C_{31}$ (F) | $L_{30}$ (H) | $C_{33}$ (F) | $L_{33}$ (H) |
| --- | --- | --- | --- | --- | --- | --- |
| 250 kHz | 5.47 nF | 77.15 µH | 27.74 nF | 15.22 µH | 5.47 nF | 77.15 µH |
| 500 kHz | 1.33 nF | 77.15 µH | 27.74 nF | 3.69 µH | 1.33 nF | 77.15 µH |
| 1 MHz | 833.87 pF | 30.86 µH | 11.10 nF | 2.32 µH | 833.87 pF | 30.86 µH |
| 2.5 MHz | 547.23 pF | 7.72 µH | 2.77 nF | 1.52 µH | 547.23 pF | 7.72 µH |
| 6.78 MHz | 71.82 pF | 7.72 µH | 2.77 nF | 199.72 nH | 71.82 pF | 7.72 µH |
| 13.56 MHz | 17.88 pF | 7.72 µH | 2.77 nF | 49.73 nH | 17.88 pF | 7.72 µH |

As detailed in Table I, the various capacitors and inductors having the delineated capacitance and inductance values, may be selected to achieve an attenuation of about 40 dB with a bandwidth frequency that spans about 10 percent of the center frequency. In an embodiment, the band stop filter 62 may be configured having a bandwidth of at least 25 kHz. For example, the bandwidth may be configured to span 25 kHz, 50 kHz, or 500 kHz. Thus, for example, a band stop filter 62 (FIG. 6) can be constructed having a selected center attenuated frequency of about 1.0M Hz by selecting C32=833.87 pF, L31=30.86 µH, C31=11.10 nF, L30=2.32 µH, C33=833.87 pF and L33=30.86 µH.

In an alternate embodiment of the electrical system 10 of the present invention, the presence of an induced electrical current within the system 10 may be minimized by utilizing magnetic field shielding within the system 10. In addition to the possibility that an electrical current may be induced within the electrical system 10 by an electromagnetic force acting against the RF antenna 18, an electrical current may be induced within the system 10 by positioning its circuitry, particularly the RF communication sub-circuit 58 within an oscillating magnetic field, of the system 10.

RF enabled communication circuit boards are often designed having an internal ground rail that is mechanically isolated from an internal voltage reference rail. However, in many cases, these rails may be electrically connected at discrete points within the circuit board. For example, a zero ohm resistor may electrically connect the ground and voltage reference rails at a discrete point thereby creating an electrical connection. As such, positioning the RF communication circuit board of the electrical system 10 within an oscillating magnetic field may cause an electrical current to be induced within the circuit 58 by electromagnetic interference between the reference voltage rail and the oscillating magnetic field. Thus, an embodiment is provided that electrically isolates a circuit board, particularly an RF communication circuit board, from an oscillating magnetic field.

Figure 10:
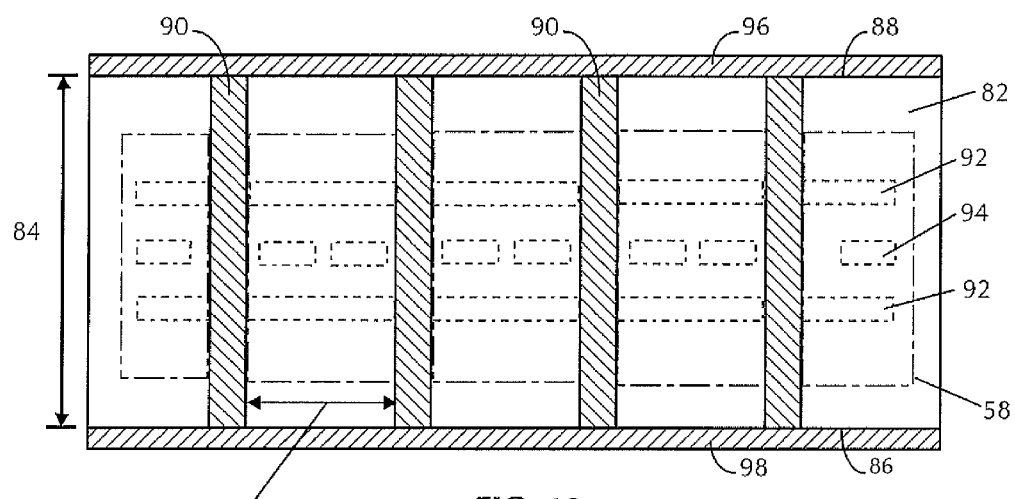
FIG. 10 illustrates an embodiment of a shielded RF communication circuit board of the present invention.
Figure 11:
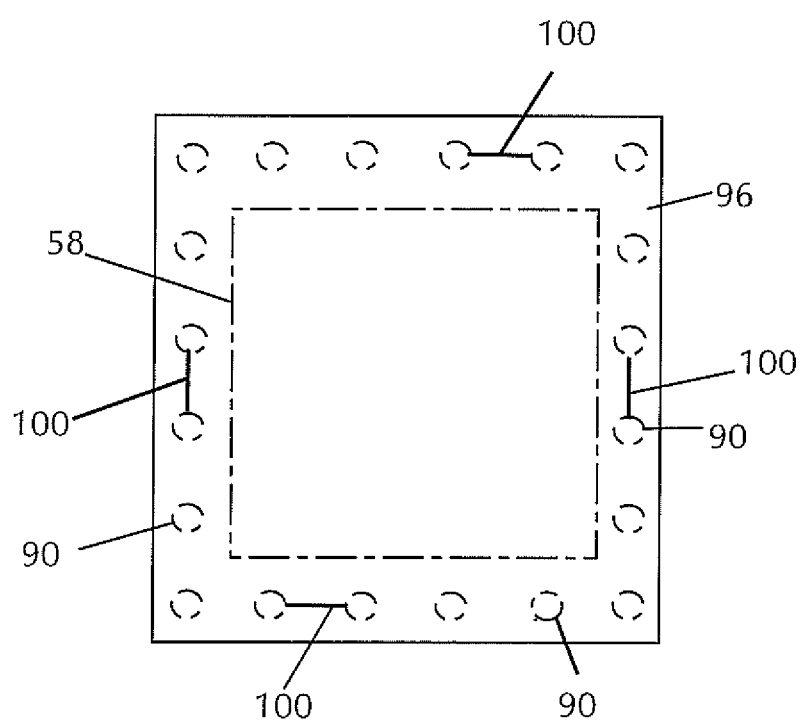
FIG. 11 is a top view of the embodiment of the shielded RF communication circuit board shown in FIG. 10.

FIG. 10 illustrates a cross-sectional view of an embodiment of an RF communication circuit board 82 that comprises magnetic field shielding. As shown, the RF communication circuit board 82 has a circuit board thickness 84 that extends between spaced apart proximal and distal ends 86, 88. In addition, the circuit board 82 is constructed having a plurality of spaced apart vias 90 that extend through the circuit board thickness 84 between the opposing proximal and distal ends 86, 88. As shown, ground rails 92 are positioned spaced apart from reference voltage rails 94 within the thickness 84 of the circuit board 82. In an embodiment, as illustrated in FIG. 11, the plurality of vias 90 are formed about a perimeter of the circuit board 82 encompassing the communication sub-circuit 58 positioned within the circuit board 82. In addition, the plurality of vias 90 may be formed encompassing the communication sub-circuit 58, the ground rails 92 and the reference voltage rails 94. As defined herein a "via" is an electrical connection by a conductive material that extends between two points. Examples of a via may include but are not limited to, a solid metal rod, an electrically conductive hollow tube, a filled tube, and an electrically conductive wire. A via 90 is preferably composed of an electrically conductive material such as a metal. Example via materials may include, but are not limited to, copper, aluminum, silver, gold, platinum, an electrically conductive polymer, an electrically conductive ceramic material, and combinations thereof.

In an embodiment, first and second electrically conductive plates 96, 98 are positioned in opposition at the respective proximal and distal ends 86, 88 of the circuit board 82, thereby sandwiching the circuit board 82 therebetween. The plates 96, 98 are positioned so that the plurality of vias 90 that extend through the thickness 84 of the circuit board 82 are electrically connected with the opposing first and second electrically conductive plates 96, 98. Thus, by positioning the circuit board 82 between the opposing plates, a Faraday cage is created that surrounds the circuit board 82 and electrically isolates the board from the surrounding magnetic field. Therefore, the possibility that an electrical current may be induced within the circuit board 82 and electrical system 10 is minimized.

In an embodiment, the first and second conductive plates 96, 98 each have a plate thickness that ranges from about 0.1 cm to about 1 cm. The electrically conductive plates 96, 98 are preferably composed of an electrically conductive material. Examples of materials that may comprise plates 96 and 98 are metals such as copper, aluminum, silver, gold, platinum, an electrically conductive polymer, an electrically conductive ceramic, and combinations thereof. Furthermore, either, or both of the conductive plates 96, 98 of the shielded circuit board 82 are connected to an electrical ground within the energy capture system 10. Thus, any induced electrical current is directed to the electrical ground and away from the circuit board 82.

In an embodiment, the vias 90 of the circuit board 82 are constructed such that they are separated by a gap 100. As defined herein, the "gap" is the space between adjacently positioned vias 90. In an embodiment, the vias 90 are positioned to create a gap 100 that is dimensioned to prevent a magnetic field from entering the circuit 58. In an embodiment, as illustrated in FIG. 11, the plurality of vias 90 are positioned around the perimeter of the circuit board 82 and encompass communication sub-circuit 58. Thus, by positioning the vias 90 so that they surround the communication sub-circuit 58, the sub-circuit 58 is isolated from the electric field about the perimeter of the circuit board 82.

In an embodiment the maximum gap dimension to electrically isolate the circuit board 82 is determined by the magnitude of the signal attenuation and the wavelength of the signal. In an embodiment, the maximum gap 100 between adjacent vias 90 to isolate the circuit board 82 from a magnetic field is defined by the equation:

$$S = 20 \times \log\left(\frac{\lambda}{2L}\right)$$

where S is equal to signal attenuation in decibels (Db), λ is equal to the wavelength of the signal of interest and L is the dimension of the via gap 100.

Thus, solving for L, the gap spacing, the equation becomes:

$$L = \left(\frac{\lambda}{2 \times 10^{S/20}}\right)$$

For example, the gap 100 spacing required to isolate the circuit board 82 from a magnetic field having a wavelength of about 44 meters at a frequency of 6.78 MHz, should be equal to or less than about:

$$\left(\frac{44.2 \text{ m}}{2 \times 10^{\frac{40}{20}}}\right) = 0.2 \text{ m}$$

In an embodiment, at least one of the other sub-circuits that comprise the electrical system 10 of the present invention may be configured with the magnetic field shielding embodiment having the sub-circuit positioned between first and second electrically conductive plates 96, 98. Moreover, at least one of the other sub-circuits that comprise the electrical system 10 of the present invention may be configured having a band-stop filter 62 electrically connected thereto. In an embodiment, at least one of the circuit boards that comprise the electrical system 10 of the present invention may be constructed such that it is shielded from a surrounding magnetic field by positioning the board in electrical contact between opposing electrically conductive plates 96, 98. This shielding is particularly important when the circuit board 12 is positioned in an oscillating magnetic field that is generated during electrical power transfer using near field resonant magnetic field coupling. Thus, by electrically connecting a band stop filter 62 to at least one of the other sub-circuits, or configuring a circuit board positioned between and in electrical contact with two electrically conductive plates, the possibility that an electrical current or electrical power may be induced within the system 10 caused by electromagnetic interference with an oscillating magnetic field, is minimized or prevented.

It is appreciated that various modifications to the inventive concepts described herein may be apparent to those of ordinary skill in the art without departing from the spirit and scope of the present invention as defined by the appended claims.

What is claimed is:
1. An electrical circuit, comprising:
a) a resonator configured to capture electrical energy wirelessly, the resonator electrically connected to an energy capture circuit and comprising:

i) a conditioning sub-circuit configured to increase or decrease an electrical impedance of the resonator and rectify an electrical current of the wirelessly captured energy;

ii) a voltage regulator sub-circuit electrically connected to the conditioning sub-circuit, the voltage regulator sub-circuit configured to increase or decrease the electrical voltage of the wirelessly captured energy; and b) a communication circuit electrically connected to the energy capture circuit, the communication circuit comprising:

i) a communication sub-circuit configured to transmit and receive a communication signal;

ii) a band stop filter electrically connected in series with the communication sub-circuit, wherein the band stop filter is configured to attenuate an electrical power at a range of selected frequencies; and iii) an antenna configured to transmit and receive the communication signal, the antenna being electrically connected in series with the band stop filter and the communication sub-circuit.

2. The electrical circuit of claim 1 wherein the selected frequencies include a range of near field magnetic resonance frequencies.

3. The electrical circuit of claim 1 wherein the selected frequencies include frequencies that range from about 250 kHz to about 13.56 MHz.

4. The electrical circuit of claim 1 wherein the band stop filter is configured to attenuate the electrical power to at least 40 dB.

5. The electrical circuit of claim 1 wherein the band stop filter is configured to attenuate the electrical power having a bandwidth of at least about 25 kHz.

6. The electrical circuit of claim 1 wherein the antenna comprises an RF single end inverted antenna.

7. The electrical circuit of claim 1 wherein communication signal has a frequency that ranges from about 1 GHz to about 10 GHz.

8. The electrical circuit of claim 1 wherein the communication sub-circuit comprises a transceiver configured to transmit and receive the communication signal.

9. The electrical circuit of claim 1 wherein the communication voltage regulator sub-circuit comprises an integrated circuit.

10. The electrical circuit of claim 1 wherein the conditioning sub-circuit comprises an impedance matching circuit electrically connected to a rectification circuit, and wherein the impedance matching circuit is configured to increase or decrease the electrical impedance of the resonator and the rectification circuit is configured to modify the wirelessly captured energy from an alternating electrical current to a direct electrical current.

11. The electrical circuit of claim 1 wherein the voltage regulator sub-circuit comprises a linear voltage regulator.

12. The electrical circuit of claim 1 comprising a communication voltage regulator sub-circuit configured to increase or decrease the amplitude of the electrical voltage of the wirelessly received electrical energy.

13. The electrical circuit of claim 1 comprising a secondary electrochemical cell, the secondary electrochemical cell electrically connectable to the energy capture circuit.

14. The electrical circuit of claim 13 wherein the secondary electrochemical cell comprises a chemistry selected from the group consisting of lithium ion (Li-ion), lithium ion polymer (Li-ion polymer), nickel metal hydride (NiMH), nickel cadmium (NiCd), and lithium iron phosphate (LiFePO$_4$).

15. The electrical circuit of claim 1 comprising a cell protection and gauging sub-circuit electrically connected to the energy capture circuit and an electrochemical cell, wherein the protection and gauging circuit is configured to electrically disconnect the electrochemical cell if a discharge voltage or temperature of the cell deviates from a predetermined value.

16. An electrical circuit, comprising:

a) a resonator configured to capture electrical energy wirelessly, the resonator being electrically connected to an energy capture circuit comprising:

i) a conditioning sub-circuit configured to increase or decrease an electrical impedance of the resonator and rectify an electrical current of the wirelessly captured energy;

ii) a voltage regulator sub-circuit electrically connected to the conditioning sub-circuit, the voltage regulator sub-circuit configured to increase or decrease the electrical voltage of the wirelessly captured energy; and b) a communication circuit electrically connected to the energy capture circuit, the communication circuit comprising a communication sub-circuit assembly configured to transmit and receive a communication signal having a radio frequency, the communication sub-circuit assembly comprising:

i) a circuit board supporting the communication sub-circuit, the circuit board having a circuit board thickness that extends between circuit board proximal and distal ends;

ii) a plurality of spaced apart vias that extend through the circuit board thickness, wherein the plurality of vias are spaced apart from each other by a gap dimensioned to isolate the circuit board from interaction with a magnetic field;

iii) first and second electrically conductive plates, wherein the first electrically conductive plate is positioned at the circuit board distal end in electrical contact with the plurality of vias and the second electrically conductive plate is positioned at the circuit board proximal end in electrical contact with the plurality of vias thereby forming an electrical connection between the first and second conductive plates through the circuit board thickness; and c) an antenna electrically connected to the communication sub-circuit configured to transmit and receive the communication signal.

17. The electrical circuit of claim 16 wherein a maximum gap dimension is defined by the equation:

$$S = 20 \times \log\left(\frac{\lambda}{2L}\right)$$

wherein S is equal to s signal attenuation in decibels (Db), $\lambda$ is equal to the wavelength of the magnetic field and L is the maximum gap dimension.

18. The electrical circuit of claim 16 wherein the magnetic field oscillates at frequencies that include a range of near field magnetic resonance frequencies.

19. The electrical circuit of claim 16 wherein the magnetic field oscillates at frequencies that range from about 250 kHz to about 13.56 MHz.

20. The electrical circuit of claim 16 wherein the first and second electrically conductive plates are composed of an electrically conductive material selected from the group consisting of copper, aluminum, silver, gold, platinum, an electrically conductive polymer, an electrically conductive ceramic, and combinations thereof.

21. The electrical circuit of claim 16 comprising a band stop filter electrically connected in series with the communication sub-circuit, wherein the band stop filter is configured to attenuate an electrical power at selected frequencies.

22. The electrical circuit of claim 21 wherein the selected frequencies include a range of near field magnetic resonance frequencies.

23. The electrical circuit of claim 21 wherein the band stop filter is configured to attenuate a magnetic field having a center frequency that ranges from 250 kHz to about 13.56 MHz.

24. The electrical circuit of claim 21 wherein the band stop filter is configured to attenuate the electrical power to at least 40 dB.

25. The electrical circuit of claim 21 wherein the band stop filter is configured to attenuate the electrical power having a bandwidth of at least about 25 kHz.

26. The electrical circuit of claim 16 wherein the antenna comprises an RF single end inverted antenna.

27. The electrical circuit of claim 16 wherein communication signal has a frequency that ranges from about 1 GHz to about 10 GHz.

28. The electrical circuit of claim 16 wherein the communication sub-circuit comprises a transceiver configured to transmit and receive the communication signal.

29. The electrical circuit of claim 16 wherein the communication voltage regulator sub-circuit comprises an integrated circuit.

30. The electrical circuit of claim 16 wherein the conditioning sub-circuit comprises an impedance matching circuit electrically connected to a rectification circuit, wherein the impedance matching circuit is configured to increase or decrease the electrical impedance of the resonator and the rectification circuit is configured to modify the wirelessly captured energy having an alternating electrical current to a direct electrical current.

31. The electrical circuit of claim 16 wherein the voltage regulator sub-circuit comprises a linear voltage regulator.

32. The electrical circuit of claim 16 comprising a communication voltage regulator sub-circuit configured to increase or decrease the amplitude of the electrical voltage of the wirelessly received electrical energy.

33. The electrical circuit of claim 16 comprising a secondary electrochemical cell, the secondary electrochemical cell electrically connectable to the energy capture circuit.

34. The electrical circuit of claim 33 wherein the secondary electrochemical cell comprises a chemistry selected from the group consisting of lithium ion (Li-ion), lithium ion polymer (Li-ion polymer), nickel metal hydride (NiMH), nickel cadmium (NiCd), and lithium iron phosphate (LiFePO$_4$).

35. The electrical circuit of claim 16 comprising a cell protection and gauging sub-circuit electrically connected to the energy capture circuit and an electrochemical cell, wherein the protection and gauging sub-circuit is configured to electrically disconnect the electrochemical cell if a discharge voltage or temperature of the cell deviates from a pre-determined value.

* * * * *